United States Patent
Charlebois et al.

(10) Patent No.: US 9,188,643 B2
(45) Date of Patent: Nov. 17, 2015

(54) FLEXIBLE PERFORMANCE SCREEN RING OSCILLATOR WITHIN A SCAN CHAIN

(71) Applicant: International Business Machines Corporation, Armonk, NY (US)

(72) Inventors: Margaret R. Charlebois, Jericho, VT (US); Christopher D. Hanudel, Essex Junction, VT (US); Robert D. Herzl, South Burlington, VT (US); David W. Milton, Underhill, VT (US); Clarence R. Ogilvie, Huntington, VT (US); Paul M. Schanely, Essex Juntion, VT (US); Tad J. Wilder, South Hero, VT (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 210 days.

(21) Appl. No.: 13/676,063

(22) Filed: Nov. 13, 2012

(65) Prior Publication Data

US 2014/0132290 A1    May 15, 2014

(51) Int. Cl.
*G01R 31/00*    (2006.01)
*G01R 31/3185*    (2006.01)

(52) U.S. Cl.
CPC .. *G01R 31/31858* (2013.01); *G01R 31/318541* (2013.01)

(58) Field of Classification Search
CPC ................... G01R 31/31924; G01R 31/31922; G01R 35/00
USPC ............................................. 324/537, 750.01
See application file for complete search history.

(56) References Cited

U.S. PATENT DOCUMENTS

| | | | |
|---|---|---|---|
| 3,665,396 A | 5/1972 | Forney, Jr. | |
| 5,592,493 A * | 1/1997 | Crouch et al. | ................ 714/729 |
| 5,689,517 A | 11/1997 | Ruparel | |
| 6,158,032 A | 12/2000 | Currier et al. | |
| 6,219,813 B1 | 4/2001 | Bishop et al. | |
| 6,388,533 B2 | 5/2002 | Swoboda | |
| 6,535,013 B2 | 3/2003 | Samaan | |
| 6,867,613 B1 * | 3/2005 | Bienek | ........................ 324/750.3 |
| 7,208,934 B2 | 4/2007 | King et al. | |
| 7,349,271 B2 | 3/2008 | Kuang et al. | |

(Continued)

FOREIGN PATENT DOCUMENTS

JP    2005003917 A    1/2005

OTHER PUBLICATIONS

IBM, "PSRO Yield and Model to Hardware Correlation Improvement for ASIC Arrays," Nov. 2008, 5 pages, IPCOM000176339D, An IP.com Prior Art Database Technical Disclosure.

(Continued)

*Primary Examiner* — Arleen M Vazquez
*Assistant Examiner* — Dominic Hawkins
(74) *Attorney, Agent, or Firm* — David Cain; Hoffman Warnick LLC (57) ABSTRACT

Aspects of the invention provide for a flexible performance screen ring oscillator (PSRO) integrated within a scan chain. In one embodiment, a circuit structure to create the flexible PSRO includes: a plurality of programmable scan chain elements; and a forward test scan chain path through the plurality of scan chain elements; wherein each of the programmable scan chain elements includes additional circuitry for a backward path, such that the backward path and the forward test scan chain path are combined to create the PSRO.

20 Claims, 7 Drawing Sheets

(56) References Cited

U.S. PATENT DOCUMENTS

| | | |
|---|---|---|
| 7,539,893 B1 | 5/2009 | Ferguson |
| 7,550,987 B2 | 6/2009 | Acharyya et al. |
| 7,609,542 B2 | 10/2009 | Adams et al. |
| 7,620,510 B2 | 11/2009 | Carpenter et al. |
| 7,835,176 B2 | 11/2010 | Adams et al. |
| 7,958,417 B2 | 6/2011 | Chakraborty et al. |
| 8,154,309 B2 | 4/2012 | Agarwal et al. |
| 8,214,699 B2 | 7/2012 | Arsovski et al. |
| 2002/0129293 A1* | 9/2002 | Hutton et al. .................. 713/500 |
| 2002/0199145 A1 | 12/2002 | Komoike |
| 2004/0098646 A1 | 5/2004 | Fisher |
| 2004/0190331 A1* | 9/2004 | Ross et al. .................... 365/154 |
| 2005/0028060 A1 | 2/2005 | Dervisoglu et al. |
| 2006/0269038 A1 | 11/2006 | Jang et al. |
| 2007/0089078 A1* | 4/2007 | Engel et al. ........................ 716/6 |
| 2007/0150780 A1* | 6/2007 | Shimooka ..................... 714/726 |
| 2007/0237012 A1 | 10/2007 | Kuang et al. |
| 2008/0034337 A1 | 2/2008 | Kuemerle et al. .................. 716/6 |
| 2008/0195337 A1* | 8/2008 | Agarwal et al. ................. 702/75 |
| 2009/0113263 A1* | 4/2009 | Cannon et al. ................. 714/726 |
| 2009/0210760 A1* | 8/2009 | Eckelman et al. ............ 714/726 |
| 2009/0295402 A1 | 12/2009 | Balch et al. |
| 2010/0042962 A1* | 2/2010 | Fazekas et al. ..................... 716/6 |
| 2010/0188888 A1* | 7/2010 | Adams et al. ................. 365/156 |
| 2010/0201418 A1* | 8/2010 | Delage et al. ................. 327/161 |
| 2010/0264932 A1* | 10/2010 | Marinissen et al. .......... 324/537 |
| 2010/0321042 A1 | 12/2010 | Agarwal et al. |
| 2012/0233512 A1 | 9/2012 | Huang et al. |
| 2013/0125073 A1 | 5/2013 | Bickford et al. |
| 2013/0179742 A1* | 7/2013 | Tekumalla ..................... 714/726 |
| 2013/0285739 A1 | 10/2013 | Blaquiere et al. |
| 2014/0132290 A1 | 5/2014 | Charlebois et al. |
| 2014/0298128 A1 | 10/2014 | Maliuk et al. |
| 2015/0032962 A1 | 1/2015 | Buyuktosunoglu et al. |

OTHER PUBLICATIONS

Gabor et al., Improving the Power-Performance of Multicore Processors Through Optimization of Lithography and Thermal Processing, Oct. 13, 2010, Improved power-performance metrics, 7 pages.

U.S. Appl. No. 14/273,261, Office Action 1 dated Apr. 23, 2015, 21 pgs.

Bickfor, J.P,; Jinjun Xiong, "Use of performance path test to optimize yield," Advanced Semiconductor Manufacturing Conference (ASMC), 2013 24th Annual SEMI, Vol. No. pp. 206, 211, May 14-16, 2013.

U.S. Appl. No. 14/273,261, Notice of Allowance dated May 4, 2015, 6 pgs.

U.S. Appl. No. 14/273,247, Ex Parte Quayle Action dated May, 7 2015, 26 pgs.

U.S. Appl. No. 14/273,247, Notice of Allowance dated Jun. 2, 2015, 9 pages.

* cited by examiner

FLEXIBLE PERFORMANCE SCREEN RING OSCILLATOR WITHIN A SCAN CHAIN

FIELD OF THE INVENTION

The disclosure relates generally to scan chains, and more particularly, to a flexible performance screen ring oscillator (PSRO) integrated within a scan chain.

BACKGROUND

As the size of integrated circuits decrease, across chip variation (ACV) is becoming an increasing concern. A transistor on one side of an integrated circuit will not always operate similar to a transistor on another side of the integrated circuit. Margins are provided in order to ensure that the integrated circuit operates as desired, which leads to reduced performance and increased power requirements.

It is desired to predict how an integrated circuit will behave, in order to minimize these margins. Performance screen ring oscillators (PSROs) are used to monitor and predict performance in areas of an integrated circuit. However, a PSRO must be in close proximity to the area that is being monitored, and in order to monitor many areas of an integrated circuit, many PSROs are needed. Therefore, current PSROs may take up significant space and wiring.

BRIEF SUMMARY

Aspects of the invention provide for a flexible performance screen ring oscillator (PSRO) integrated within a scan chain. In one embodiment, a circuit structure to create the flexible PSRO includes: a plurality of programmable scan chain elements; and a forward test scan chain path through the plurality of scan chain elements; wherein each of the programmable scan chain elements includes additional circuitry for a backward path, such that the backward path and the forward test scan chain path are combined to create the PSRO.

A first aspect of the disclosure provides a circuit structure to create a flexible performance screen ring oscillator (PSRO), the circuit structure comprising: a plurality of programmable scan chain elements; and a forward test scan chain path through the plurality of scan chain elements; wherein each of the programmable scan chain elements includes additional circuitry for a backward path, such that the backward path and the forward test scan chain path are combined to create the PSRO.

A second aspect of the disclosure provides a method for implementing a flexible performance screen ring oscillator (PSRO), the method comprising: providing a plurality of programmable scan chain elements, each of the programmable scan chain elements including additional circuitry for a backward path, the plurality of programmable scan chain elements including a forward test scan chain path that combines with the backward path to create the PSRO; programming each of the programmable scan chain elements to create the PSRO within the plurality of programmable scan chain elements; implementing the forward test scan chain path through the plurality of programmable scan chain elements, such that an observable output provides a forward path scan output; and implementing the PSRO, such that the observable output provides a backward path input.

A third aspect of the disclosure provides a design structure tangibly embodied in a machine readable medium for testing an integrated circuit chip, the design structure comprising: a circuit structure to create a flexible performance screen ring oscillator (PSRO), the circuit structure comprising: a plurality of programmable scan chain elements; and a forward test scan chain path through the plurality of scan chain elements; wherein each of the programmable scan chain elements includes additional circuitry for a backward path, such that the backward path and the forward test scan chain path are combined to create the PSRO.

BRIEF DESCRIPTION OF THE DRAWINGS

The above and other aspects, features and advantages of the disclosure will be better understood by reading the following more particular description of the disclosure in conjunction with the accompanying drawings.

The drawings are not necessarily to scale. The drawings are merely schematic representations, not intended to portray specific parameters of the disclosure. The drawings are intended to depict only typical embodiments of the disclosure, and therefore should not be considered as limiting the scope of the disclosure. In the drawings, like numbering represents like elements.

DETAILED DESCRIPTION

As mentioned, the disclosure relates generally to scan chains, and more particularly, to a flexible performance screen ring oscillator (PSRO) integrated within a scan chain.

As the size of integrated circuits decrease, across chip variation (ACV) is becoming an increasing concern. A transistor on one side of an integrated circuit will not always operate similar to a transistor on another side of the integrated circuit. Margins are provided in order to ensure that the integrated circuit operates as desired, which leads to reduced performance and increased power requirements.

It is desired to predict how an integrated circuit will behave, in order to minimize these margins. Performance screen ring oscillators (PSROs) are used to monitor and predict areas of an integrated circuit. However, a PSRO must be in close proximity to the area that is being monitored, and in order to monitor many areas of an integrated circuit, many PSROs are needed. Therefore, current PSROs may take up significant space and wiring.

Aspects of the invention provide for a flexible performance screen ring oscillator (PSRO) integrated within a scan chain. In one embodiment, a circuit structure to create the flexible PSRO includes: a plurality of programmable scan chain elements; and a forward test scan chain path through the plurality of scan chain elements; wherein each of the programmable scan chain elements includes additional circuitry for a backward path, such that the backward path and the forward test scan chain path are combined to create the PSRO. The flexible PSRO is integrated with existing scan chains located on an integrated circuit. Further, scan chain elements may be programmed to create a PSRO of any size.

Figure 1:
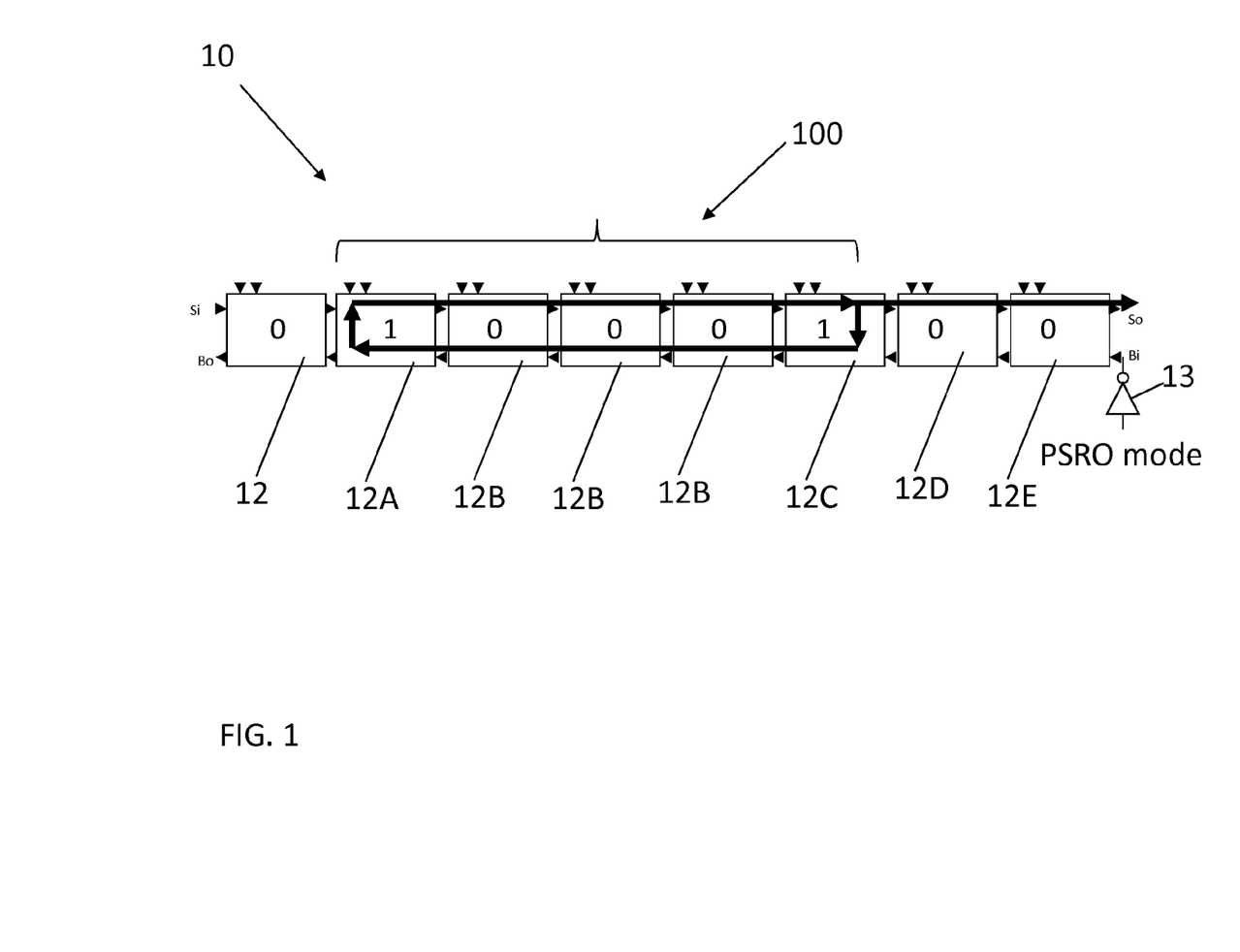
FIG. 1 is a schematic view of a circuit structure according to embodiments of the invention.

Turning now to FIG. 1, a schematic view of a circuit structure 10 according to embodiments of the invention is shown. As will be described herein, circuit structure 10 is used to create a flexible performance screen ring oscillator (PSRO) 100 within a plurality of scan chain elements 12. Although only eight programmable scan chain elements 12 are shown, it is understood that this is for clarity purposes only, and that any number of scan chain elements 12 are possible. Further, scan chain elements 12 can include similar voltage threshold types, so that PSRO 100 includes scan chain elements 12A-C that are the same. Alternatively, PSRO 100 may include scan chain elements 12 that have pre-defined ratios of voltage threshold types.

A forward test scan chain path, as known to one skilled in the art, from "Si" to "So", is provided through the plurality of programmable scan chain elements 12. However, a backward path, from "Bi" to "Bo", is also provided. As will be described in FIGS. 2-6, additional circuitry 20 is provided for the backward path. The backward path (from "Bi" to "Bo") combines with the forward test scan chain path ("Si" to "So") in order to create the PSRO 100.

In order to create PSRO 100, a scan chain element 12A is programmed with a "1" to start the PSRO 100. Scan chain element 12C is programmed with a second "1" to end the PSRO 100. As seen in FIG. 1, between scan chain element 12A and scan chain element 12C, scan chain elements 12B are programmed with "0." With reference to FIGS. 2-6, in order to program desired data (via scan input "Si") into each of the plurality of scan chain elements 12, a "Scan mode" input is set to high and a "PSRO mode" input is set to low. The scan input ("Si") is passed by multiplexer 14 and held by latch 16. Desired data may also be programmed using functional input "Di."

In this way, the size of PSRO 100 may be any size, as desired. In the embodiment shown in FIG. 1, PSRO 100 is 5 scan chain elements long. However, for example, PSRO 100 may be programmed to include 100 scan chain elements. Therefore, PSRO 100 may be programmed to measure a local (small) performance area of an integrated circuit or a global (large) performance area of the integrated circuit.

Figure 2:
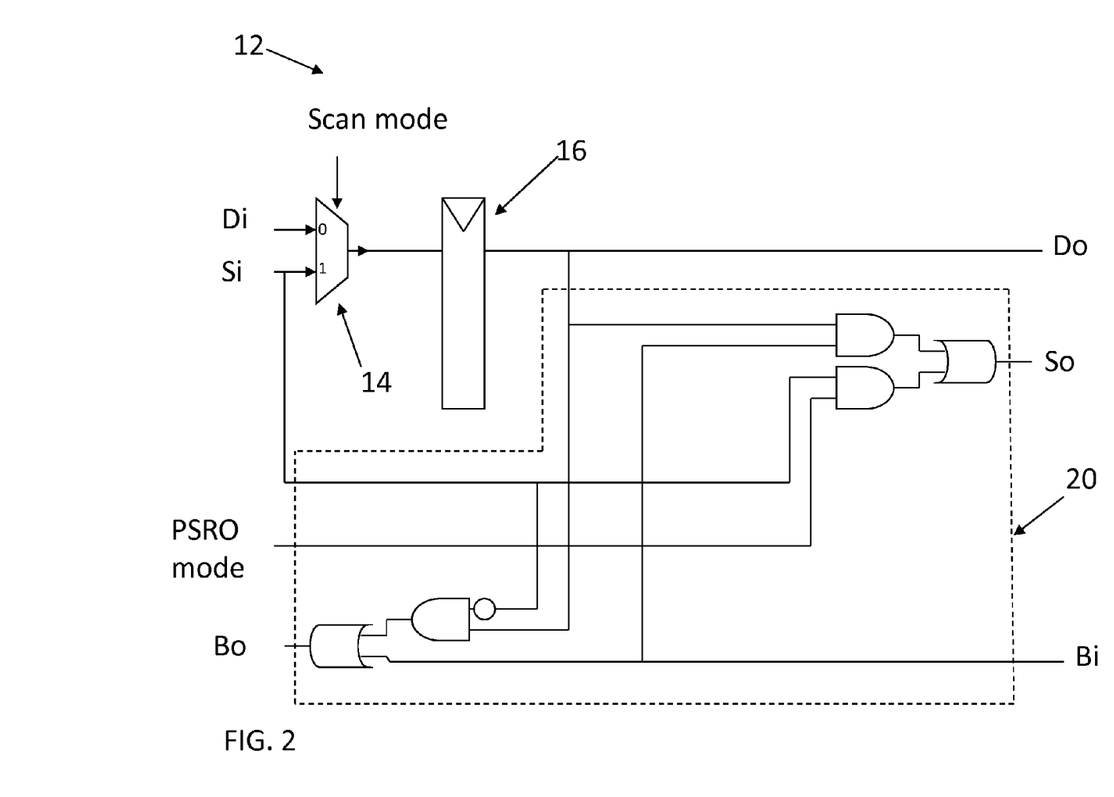
FIG. 2 is circuit diagram of a scan chain element according to embodiments of the invention.

Turning now to FIG. 2, a circuit diagram of a scan chain element 12 according to embodiments of the invention is shown. During "normal" test scan operation, a forward test chain path is implemented. "Scan mode" is set high and "PSRO mode" is set low. Therefore, "Si" data is passed through multiplexer 14 and held by latch 16, and passed to output "So". The observable output is a forward path scan output "So".

Figure 3:
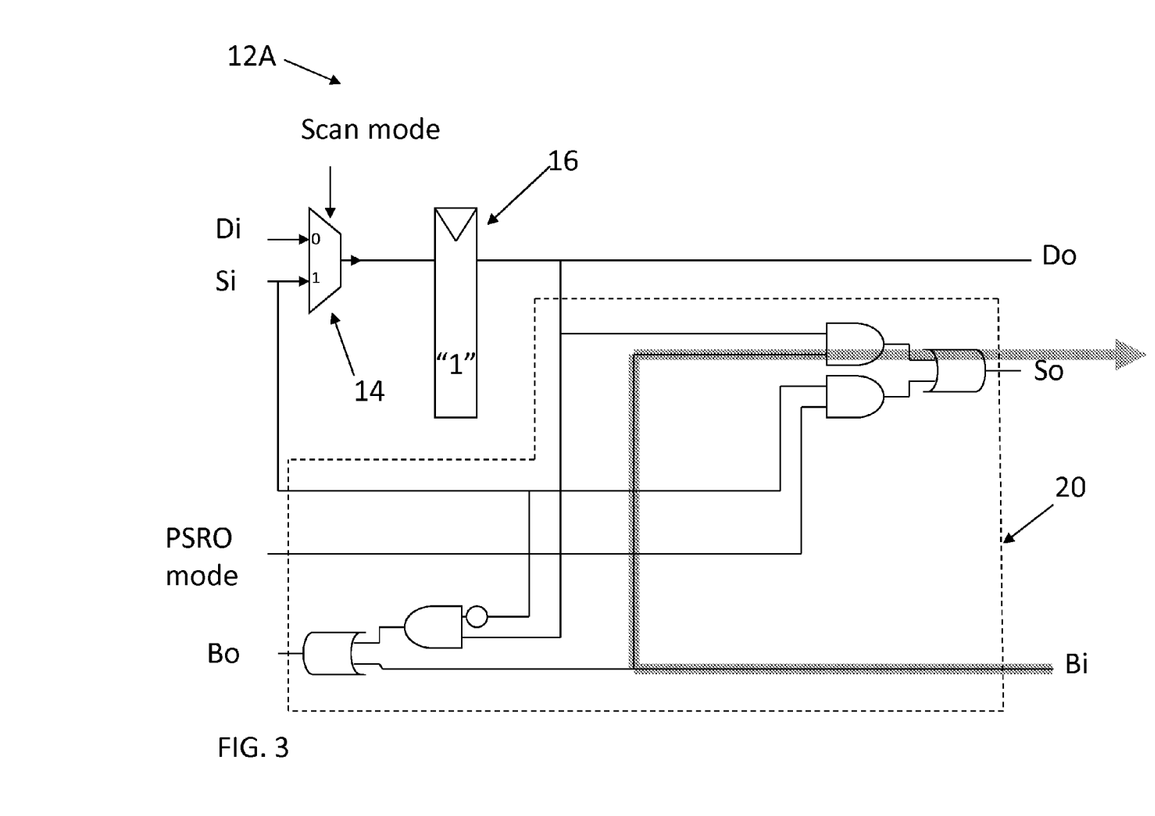
FIG. 3 is circuit diagram of a scan chain element according to embodiments of the invention.
Figure 4:
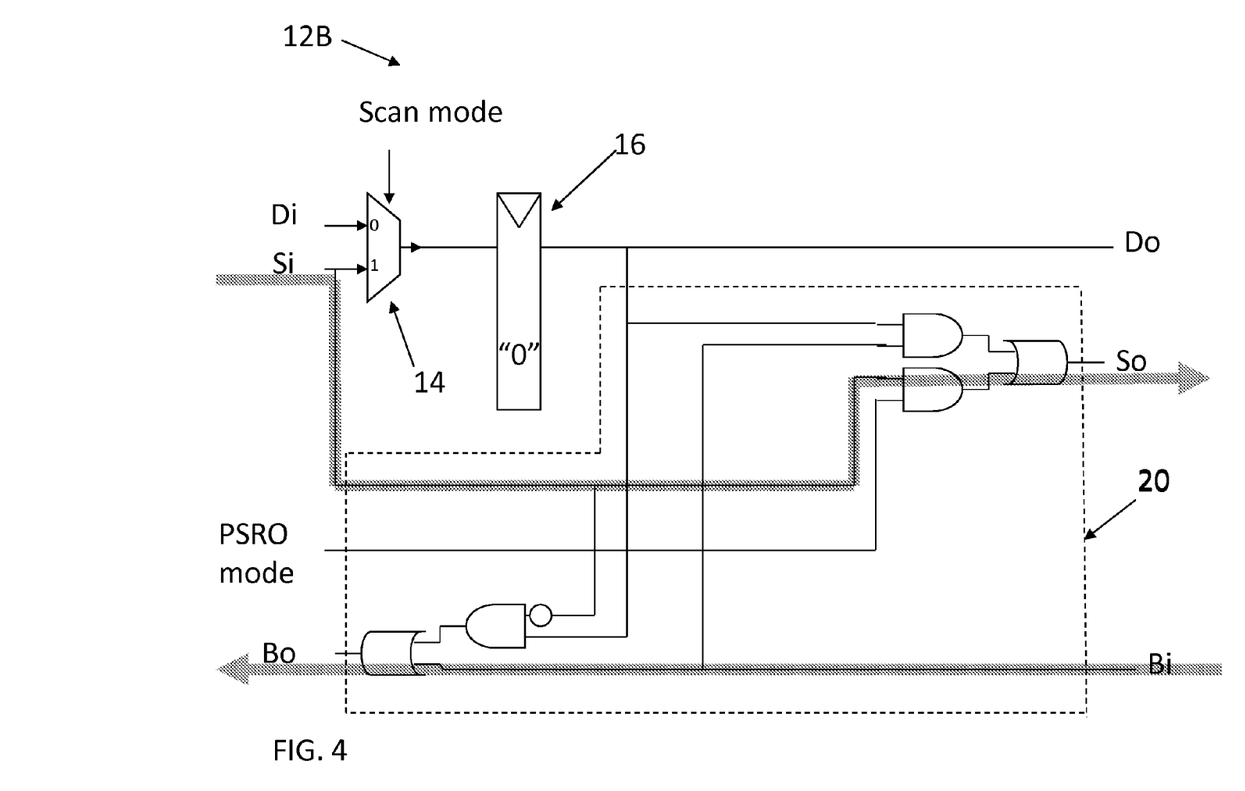
FIG. 4 is circuit diagram of a scan chain element according to embodiments of the invention.
Figure 5:
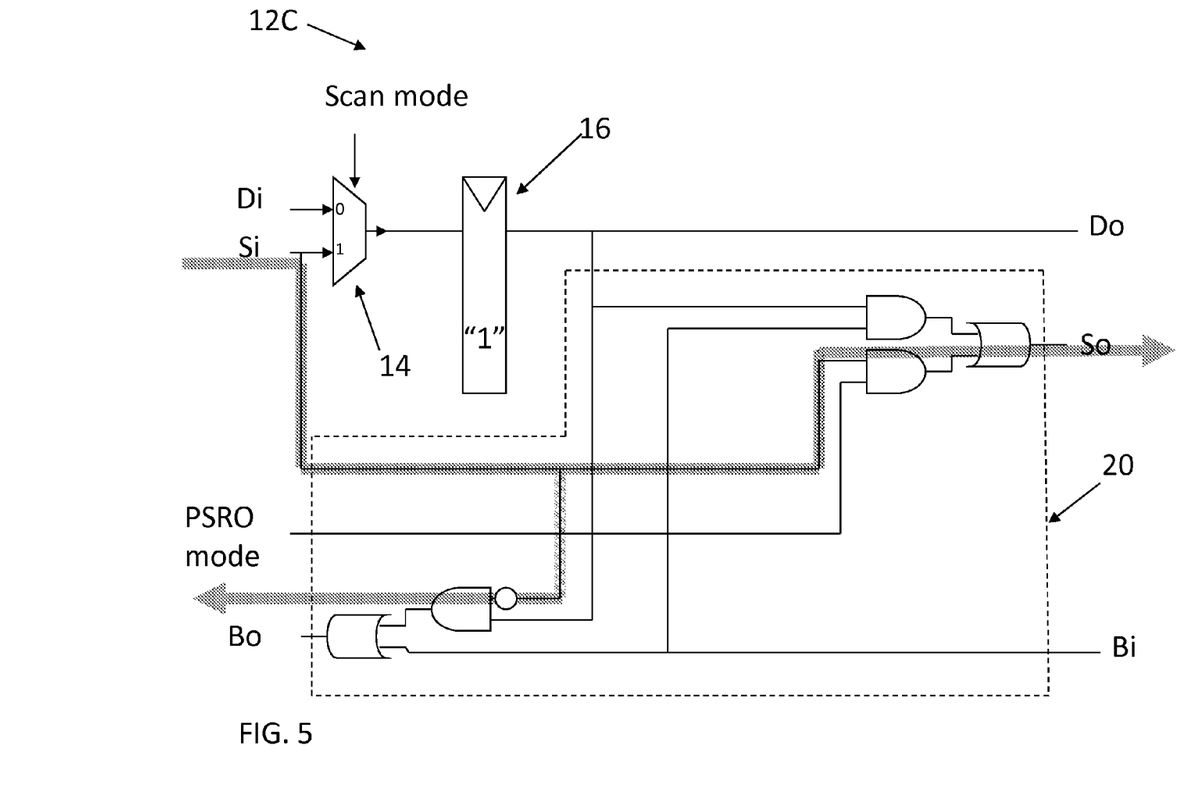
FIG. 5 is circuit diagram of a scan chain element according to embodiments of the invention.

Turning now to FIGS. 3-5, circuit diagrams of scan chain elements 12A-C according to embodiments of the invention are shown. That is, the scan chain elements 12A-C that create PSRO 100 are shown. In operation, the PSRO 100, when in PSRO mode, rings at a frequency that can be detected. This frequency indicates the speed at which the integrated circuit is operating at. In order for PSRO mode to be activated, "Scan mode" is set high and "PSRO mode" is set low. In addition, scan input "Si" of first element 12 of circuit structure 10 is set to low.

In FIG. 5, the second "1" in PSRO 100 in scan chain element 12C is shown. The input from "Bi" is received, which is also the inverse of "PSRO mode." With reference to FIG. 1, the inverse of "PSRO mode" is received by scan chain element 12E through inverter 13, passed through the backward path of scan chain element 12E, through the backward path of scan chain element 12D, to the backward path of scan chain element 12C. This conditions scan chain element 12C as the end of the PSRO loop 100. This creates a path from scan input "Si" of scan chain element 12C to output "Bo" of scan chain element 12C, passing data from the forward path of scan chain element 12C to the backward path of scan chain element 12C, thus completing the end of the PSRO loop 100. This allows for oscillation within the PSRO loop 100. The second "1" in PSRO 100 also creates a PSRO observation path from input "Si" of scan chain element 12C to output "So" of scan chain element 12C. This observation path is continued through the forward paths of scan chain elements 12D and 12E.

In FIG. 4, the "0" is PSRO 100 in scan chain element 12B is shown. The backwards output "Bo" from scan chain element 12C (FIG. 5) is received as the backwards input "Bi" for scan chain element 12B and is passed through as the backwards output "Bo" for scan chain element 12B. The scan input "Si" of scan chain element 12B is received from scan output "So" of scan chain element 12A in PSRO 100 and is passed through to scan output "So" of scan chain element 12B. It is understood that if there are multiple "0" in the PSRO 100 (i.e., multiple scan chain element 12B) in PSRO 100, the scan output "So" of scan chain element 12A may pass through to multiple scan chain elements 12B.

In FIG. 3, the first "1" in PSRO 100 in scan chain element 12A is shown. The backwards input "Bi" is received from backwards output "Bo" of scan chain element 12B, and is passed through to scan output "So" of scan chain element 12A, such that scan chain element 12A is the beginning of PSRO 100.

Delta measurements between differing PSROs may also be determined to provide an across chip variation (ACV) measurement. That is, for example, the frequency of PSRO 100 shown in FIG. 1 may be measured and compared with the frequency of a PSRO that is different from PSRO 100. For example, the first "1" in PSRO 100 may be moved to the scan chain element 12 on the left. In this case, the PSRO 100 would include 6 scan chain elements 12. Therefore, the difference between the measured frequencies would indicate the delay in the first scan chain element 12.

Figure 6:
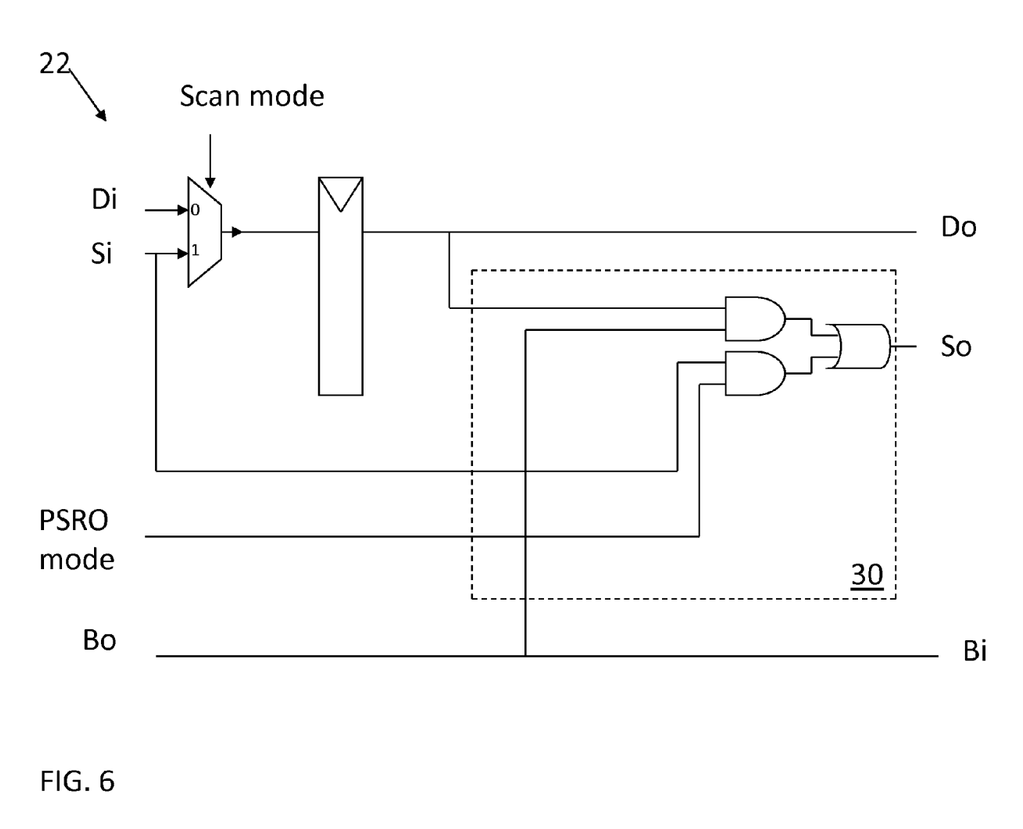
FIG. 6 is circuit diagram of a scan chain element according to embodiments of the invention.

Turning now to FIG. 6, a circuit diagram of scan chain element 22 according to embodiments of the invention is shown. In this embodiment, the additional circuitry 30 is a reduced version of the additional circuitry 20 shown in FIGS. 2-5. This embodiment reduces the amount of logic needed to implement the backward path, and the PSRO 100. However, in this embodiment, the last scan chain element 12 (i.e., wherein backward path input "Bi" is received) must always be a part of the PSRO.

It is understood that PSRO 100 may oscillate at a frequency that is too high to detect. Therefore, as known to those skilled in the art, the signal may be sent to the chip boundary of the integrated circuit though a signal divider to be able to measure the frequency. Further, it is understood that other scan chain elements do not include multiplexer 14. In this embodiment, multiplexer 14 would be outside the scan chain element, and "Si" would not be accessible for additional circuitry 20. Therefore, the signal for the additional circuitry 20 would be accessed from the output of the external multiplexer.

Figure 7:
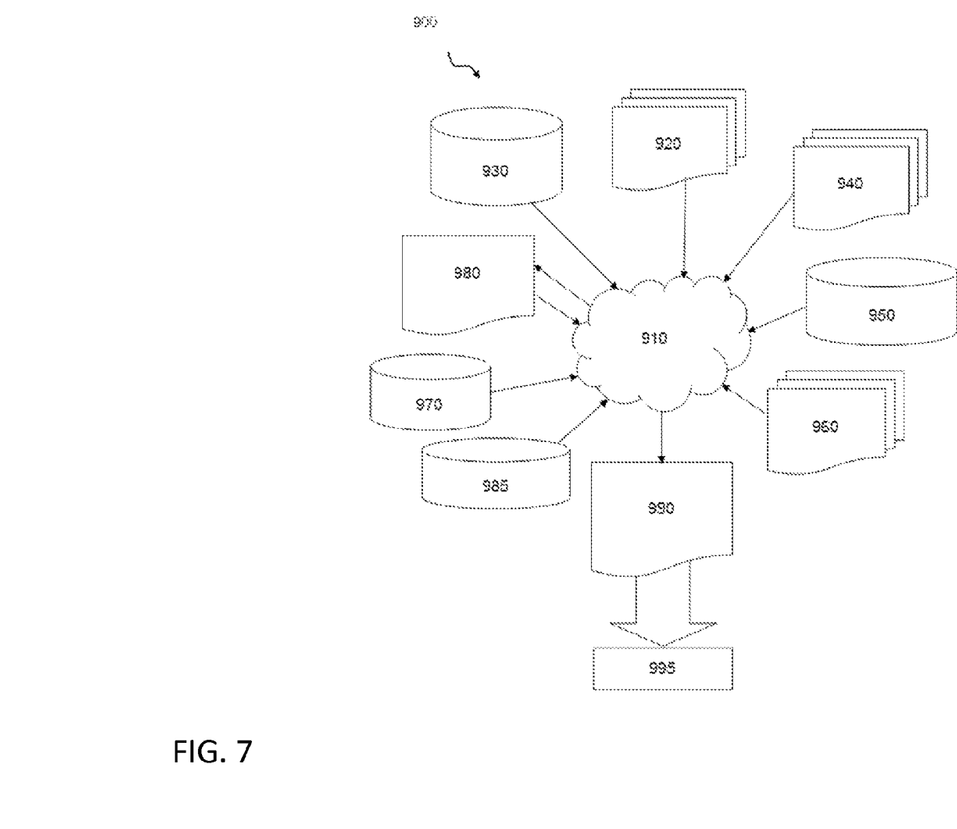
FIG. 7 is a flow diagram of a design process used in semiconductor design, manufacture, and/or test according to embodiments of the invention.

FIG. 7 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-6. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 7 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-6. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-6 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-6. In one embodiment, design structure 990 may comprise a compiled, executable HDL simulation model that functionally simulates the devices shown in FIGS. 1-6.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/ developer to produce a device or structure as described above and shown in FIGS. 1-6. Design structure 990 may then proceed to a stage 995 where, for example, design structure 990: proceeds to tape-out, is released to manufacturing, is released to a mask house, is sent to another design house, is sent back to the customer, etc.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A circuit structure to create a flexible performance screen ring oscillator (PSRO), the circuit structure comprising:
    a plurality of programmable scan chain elements, each of the plurality of programmable scan chain elements including a programmable ring start point and a programmable ring end point for controlling a number of the programmable scan chain elements in the PSRO; and
    a forward test scan chain path through the plurality of programmable scan chain elements;
    wherein each of the programmable scan chain elements includes additional circuitry for a backward path, such that the backward path and the forward test scan chain path are combined to create the PSRO, wherein the number of programmable scan chain elements included in the PSRO is controlled by:
        selectively programming the programmable ring start point of a first programmable scan chain element in the forward test scan chain path to a first logic value;
        selectively programming the programmable ring end point of a second programmable scan chain element in the forward test scan chain path to the first logic value; and
        selectively programming at least one programmable scan chain element located between the first and second programmable scan chain elements in the forward test scan chain path to a second logic value, wherein the second logic value is different than the first logic value, and wherein all of the at least one programmable scan chain elements located between the first and second programmable scan chain elements in the forward test scan chain path are programmed to the second logic value.

2. The circuit structure of claim 1, wherein each programmable scan chain element is programmed to create the PSRO within the plurality of programmable scan chain elements.

3. The circuit structure of claim 1, wherein the PSRO can be programmed to measure local or global performance of a chip.

4. The circuit structure of claim 1, further comprising a plurality of PSROs within the plurality of programmable scan chain elements.

5. The circuit structure of claim 4, wherein delta measurements between differing PSROs provide an across chip variation (ACV) measurement.

6. The circuit structure of claim 1, wherein each of the programmable scan chain elements include a similar voltage threshold type.

7. The circuit structure of claim 1, further comprising an observable output that provides one of: a forward path scan output, or a backward path input.

8. A method for implementing a flexible performance screen ring oscillator (PSRO), the method comprising:
    providing a plurality of programmable scan chain elements, each of the plurality of programmable scan chain elements including a programmable ring start point and a programmable ring end point for controlling a number of the programmable scan chain elements in the PSRO, and wherein each of the programmable scan chain elements includes additional circuitry for a backward path, the plurality of programmable scan chain elements including a forward test scan chain path that combines with the backward path to create the PSRO;
    programming each of the programmable scan chain elements to create the PSRO within the plurality of programmable scan chain elements, wherein the number of programmable scan chain elements included in the PSRO is controlled by:
        selectively programming the programmable ring start point of a first programmable scan chain element in the forward test scan chain path to a first logic value;
        selectively programming the programmable ring end point of a second programmable scan chain element in the forward test scan chain path to the first logic value; and
        selectively programming at least one programmable scan chain element located between the first and second programmable scan chain elements in the forward test scan chain path to a second logic value, wherein the second logic value is different than the first logic value, and wherein all of the at least one programmable scan chain elements located between the first and second programmable scan chain elements in the forward test scan chain path are programmed to the second logic value;
    implementing the forward test scan chain path through the plurality of programmable scan chain elements, such that an observable output provides a forward path scan output; and
    implementing the PSRO, such that the observable output provides a backward path input.

9. The method of claim 8, wherein programming each of the programmable scan chain elements includes programming the PSRO to measure local or global performance of a chip.

10. The method of claim 8, wherein programming includes scanning data into each of the programmable scan chain elements to create the PSRO.

11. The method of claim 8, further comprising programming a second PSRO within the plurality of programmable scan chain elements.

12. The method of claim 11, further comprising implementing the second PSRO, and determining delta measurements between a first PSRO and the second PSRO to provide an across chip variation (ACV) measurement.

13. The method of claim 8, wherein each of the programmable scan chain elements include a similar voltage threshold type.

14. A design structure tangibly embodied in a machine readable medium for testing an integrated circuit chip, the design structure comprising:
  a circuit structure to create a flexible performance screen ring oscillator (PSRO), the circuit structure comprising:
    a plurality of programmable scan chain elements, each of the plurality of programmable scan chain elements including a programmable ring start point and a programmable ring end point for controlling a number of the programmable scan chain elements in the PSRO; and
    a forward test scan chain path through the plurality of programmable scan chain elements;
    wherein each of the programmable scan chain elements includes additional circuitry for a backward path, such that the backward path and the forward test scan chain path are combined to create the PSRO, wherein the number of programmable scan chain elements included in the PSRO is controlled by:
      selectively programming the programmable ring start point of a first programmable scan chain element in the forward test scan chain path to a first logic value;
      selectively programming the programmable ring end point of a second programmable scan chain element in the forward test scan chain path to the first logic value; and
      selectively programming at least one programmable scan chain element located between the first and second programmable scan chain elements in the forward test scan chain path to a second logic value, wherein the second logic value is different than the first logic value, and wherein all of the at least one programmable scan chain elements located between the first and second programmable scan chain elements in the forward test scan chain path are programmed to the second logic value.

15. The design structure of claim 14, wherein each programmable scan chain element is programmed to create the PSRO within the plurality of programmable scan chain elements.

16. The design structure of claim 14, wherein the PSRO can be programmed to measure local or global performance of a chip.

17. The design structure of claim 14, further comprising a plurality of PSROs within the plurality of programmable scan chain elements.

18. The design structure of claim 17, wherein delta measurements between differing PSROs provide an across chip variation (ACV) measurement.

19. The design structure of claim 14, wherein each of the programmable scan chain elements include a similar voltage threshold type.

20. The design structure of claim 14, further comprising an observable output that provides one of: a forward path scan output, or a backward path input.

* * * * *